(12) United States Patent
Nam

(10) Patent No.: US 7,361,571 B2
(45) Date of Patent: Apr. 22, 2008

(54) METHOD FOR FABRICATING A TRENCH ISOLATION WITH SPACERS

(75) Inventor: Sang Woo Nam, Cheongju-si (KR)

(73) Assignee: Dongbuanam Semiconductor Inc., Seoul (KR)

( * ) Notice: Subject to any disclaimer, the term of this patent is extended or adjusted under 35 U.S.C. 154(b) by 0 days.

(21) Appl. No.: 11/319,411

(22) Filed: Dec. 29, 2005

(65) Prior Publication Data

US 2007/0020878 A1    Jan. 25, 2007

(30) Foreign Application Priority Data

Jul. 21, 2005  (KR) ............... 10-2005-0066426

(51) Int. Cl.
  H01L 21/76   (2006.01)
  H01L 21/311  (2006.01)
(52) U.S. Cl. .......... 438/424; 438/692; 438/757; 438/700; 257/E21.546
(58) Field of Classification Search .......... 438/424, 438/692, 757, 700; 257/E21.546
See application file for complete search history.

(56) References Cited

U.S. PATENT DOCUMENTS

| | | | |
|---|---|---|---|
| 4,819,052 A * | 4/1989 | Hutter ............... | 257/378 |
| 5,372,968 A * | 12/1994 | Lur et al. ............... | 438/425 |
| 5,424,240 A * | 6/1995 | Han ............... | 438/446 |
| 5,506,168 A * | 4/1996 | Morita et al. ............... | 438/424 |
| 6,117,726 A * | 9/2000 | Tsai et al. ............... | 438/242 |
| 6,258,726 B1 * | 7/2001 | Park et al. ............... | 438/712 |
| 6,355,539 B1 * | 3/2002 | Lai et al. ............... | 438/424 |
| 6,746,935 B2 * | 6/2004 | De Coster et al. ............... | 438/433 |

* cited by examiner

Primary Examiner—Zandra V. Smith
Assistant Examiner—Ron Pompey
(74) Attorney, Agent, or Firm—Pillsbury Winthrop Shaw Pittman LLP

(57) ABSTRACT

A method for forming a shallow trench isolation (STI) in a semiconductor device, is presented. In one embodiment, the method includes successively forming a pad oxide and a pad nitride on a silicon substrate, successively etching the pad nitride, the pad oxide, and the silicon substrate to form a trench having a predetermined depth in the silicon substrate, and depositing a trench filling oxide to fill the trench. The method further includes polishing the trench filling oxide until the pad nitride is exposed, depositing a protective nitride to cover surface of the substrate including the pad nitride and the trench filling oxide, and isotropically etching the protective nitride and the pad nitride to form spacers.

8 Claims, 4 Drawing Sheets

METHOD FOR FABRICATING A TRENCH ISOLATION WITH SPACERS

RELATED APPLICATION AND PRIORITY INFORMATION

The present application claims priority to and the benefit of Korean Patent Application No. 10-2005-0066426 filed in the Korean Intellectual Property Office on Jul. 21, 2005, the entire contents of which are incorporated by reference.

BACKGROUND OF THE INVENTION

1. Field of the Invention

The present invention relates to a method of forming a trench isolation in a semiconductor device, and more specifically, to a method of forming trench isolation in a semiconductor device.

2. Description of the Related Art

Shallow trench isolation (STI) technology is considered a more viable isolation technology than traditional local oxidation of silicon (LOCOS) because STI does not create what is known as "bird's beaks" of LOCOS. As such, STI achieves reduced conversion differences and occupies less area.

The conventional STI fabrication techniques include forming a pod oxide on a semiconductor substrate surface, forming a pad nitride on the pad oxide, forming a pattern layer for opening an isolation region in the substrate surface, anisotropically etching the opened region from the pad oxide and pad nitride to form a trench in the semiconductor substrate, forming a thermal oxide liner in the trench and then filling the trench with insulating material, such as silicon oxide.

During subsequent processing, the pad oxide and pad nitride layers are removed followed by formation of active regions, which typically involve masking, ion implantation, and cleaning steps. The cleaning steps may include cleaning before deposition of sacrificial oxide layer, and cleaning before ion implantation for well formation and the threshold voltage. Since the corners of the STI define the boundaries between active and field regions, they are affected by such cleaning steps as well as a wet etching step for forming the sacrificial oxide layer. The wet etching step typically uses sulfuric acid and hydrofluoric acid solutions. These acidic solutions may isotropically remove the top corners of STI leaving a void or "divot" 16 in the oxide fill as shown in FIG. 8.

The STI divots are problematic in various respects. For instance, STI divots are responsible for high field edge leakage, particularly with shallow source/drain junctions. Further, the growth of gate oxide in the divot area is abnormal, resulting in thinner gate oxide layer and thicker gate polysilicon at its edges. Therefore, the threshold voltage is altered and hot carrier injection (HCI) due to electric field concentration may occur.

SUMMARY OF THE INVENTION

Principles of the present invention, as embodied and broadly described herein, are directed to providing a method for forming highly reliable STI in semiconductor devices without divots. In one embodiment, the present invention may be directed to a method for forming a shallow trench isolation (STI) in a semiconductor device, comprising (a) successively forming a pad oxide and a pad nitride on a silicon substrate; (b) successively etching the pad nitride, the pad oxide and the silicon substrate to form a trench having a predetermined depth in the silicon substrate; (c) depositing a trench filling oxide to fill the trench; (d) polishing the trench filling oxide until the pad nitride is exposed; (e) depositing a protective nitride to cover surface of the substrate including the pad nitride, the trench filling oxide; and (f) isotropically etching the protective nitride and the pad nitride to form spacers.

Subsequent to successively forming a pad oxide and a pad nitride, the method may also comprise (a1) forming a hard mask oxide on the pad nitride; and (a2) selectively etching the hard mask oxide to expose substrate regions where the STI is to be formed.

In addition, the pad nitride, the pad oxide and the silicon substrate may be successively and selectively etched with using the hard mask oxide as a etch mask.

These and other aspects of embodiments of the invention will become evident by reference to the following description of embodiments, simply by way of illustration of the best mode contemplated for carrying out the present invention, often referring to the accompanying drawings.

BRIEF DESCRIPTION OF DRAWINGS

The accompanying drawings, which are incorporated in and constitute a part of this Specification, depict corresponding embodiments of the invention, by way of example only, and it should be appreciated that corresponding reference symbols indicate corresponding parts. In the drawings, FIGS. 1 to 7 are cross-sectional views for illustrating sequential phases of a method for forming STI, in which:

FIG. 1 illustrates the formation of a pad oxide, a pad nitride and a hard mask oxide;

FIG. 2 illustrates the etching of a trench;

FIG. 3 illustrates the formation of trench filling oxide;

FIG. 4 illustrates polishing step of the trench filling oxide;

FIG. 5 illustrates the formation of protective nitride;

FIG. 6 illustrates the formation of a spacer; and

FIG. 7 illustrates etching step of the spacer.

DETAILED DESCRIPTION OF EMBODIMENTS OF THE INVENTION

Hereinafter, preferred embodiments of the present invention will be described with reference to FIGS. 1 to 7.

Figure 1:
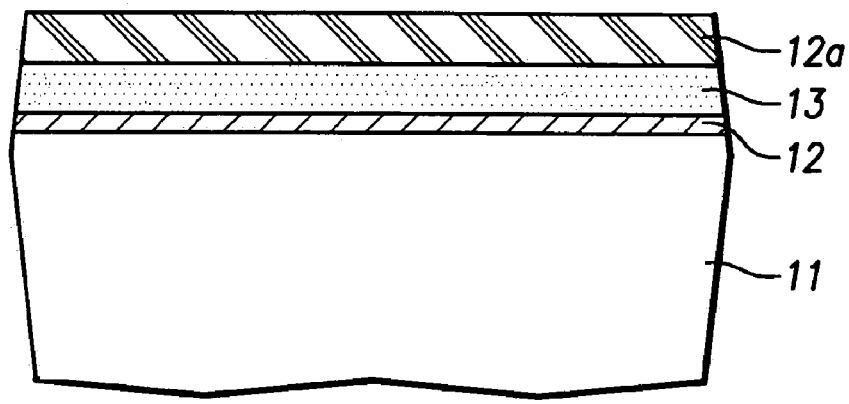

Referring to FIG. 1, a pad oxide 11, a pad nitride 13, and a hard mask oxide 12a are sequentially formed on a semiconductor substrate 11. The pad oxide may be formed by a thermal oxidation, and the pad nitride 13 and the hard mask oxide 12a may be formed by deposition techniques. The hard mask oxide 12a is used as an etch mask in subsequent trench etching process, and the pad nitride 13 is employed as polish stop layer in subsequent polishing step of a trench filling oxide layer.

Figure 2:
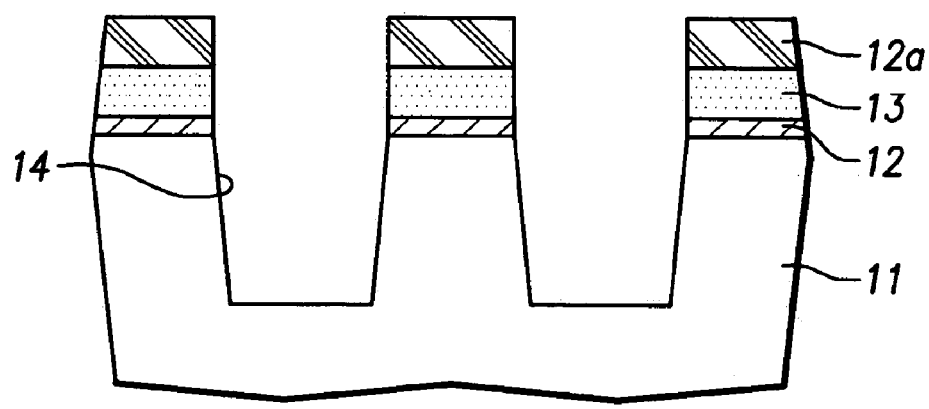

Subsequently, a photo mask pattern that defines isolation regions in the semiconductor substrate 11 is formed, and the hard mask oxide 12a is selectively etched with using the photo mask pattern as a etch mask. By using the hard mask oxide 12a as a etch mask, the pad nitride 13, pad oxide 12, and silicon substrate 11 are sequentially and selectively etched to form a trench 14 having a predetermined depth in the silicon substrate 11 as shown in FIG. 2.

Figure 3:
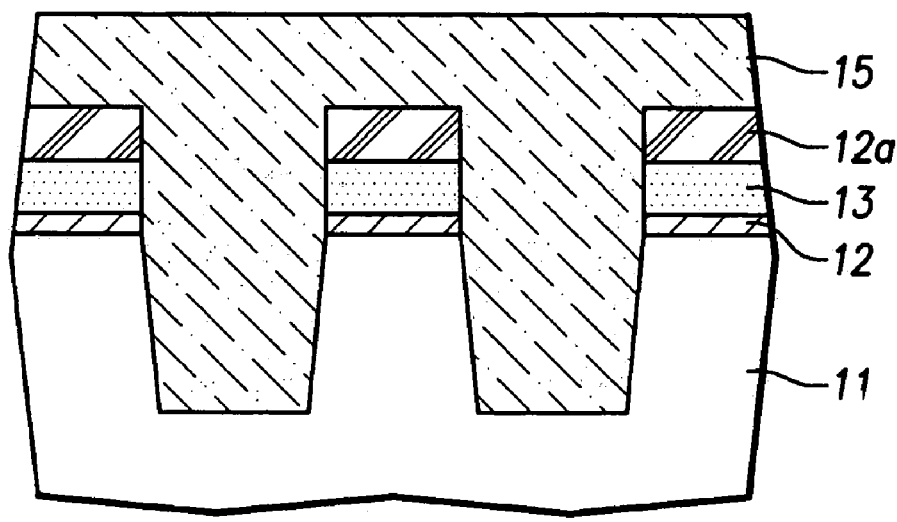
Figure 4:
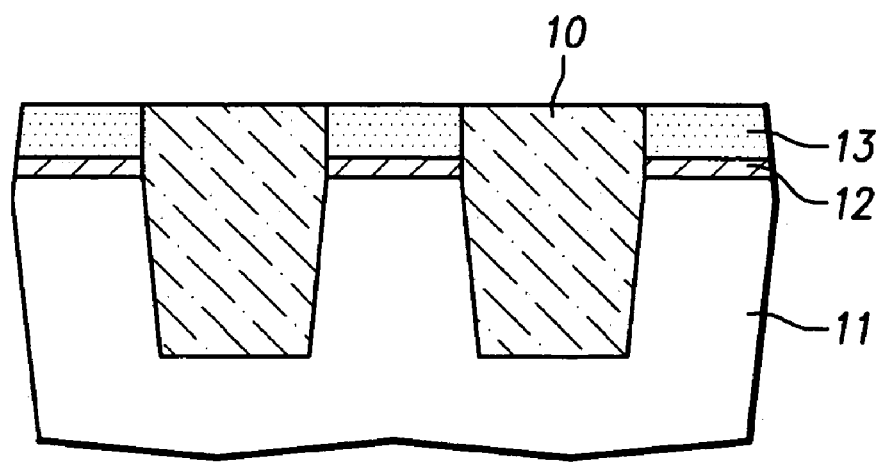

Referring to FIG. 3, a trench-filling oxide 15 is formed. The trench filling oxide 15 may be made of TEOS and deposited enough to completely fill the trench 14. Then, the trench filling oxide 15 is polished by e.g., chemical mechanical polishing (CMP) process until the pad nitride 13 is exposed, thereby forming an STI region 10 as shown in FIG. 4.

Figure 5:
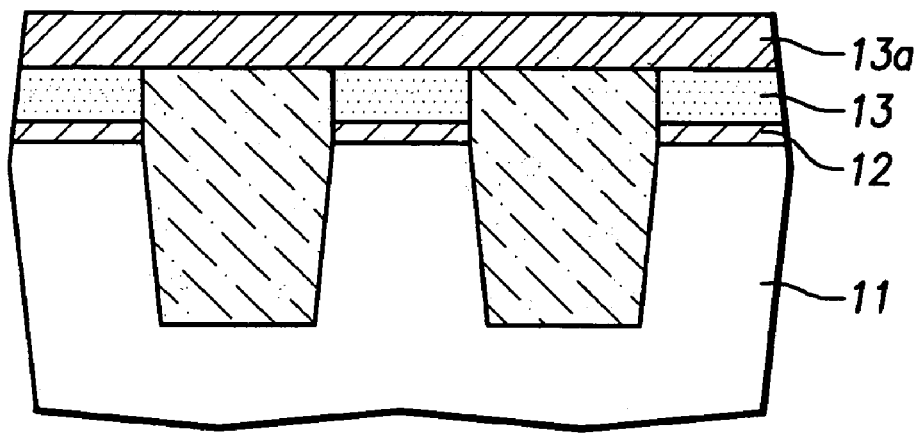
Figure 6:
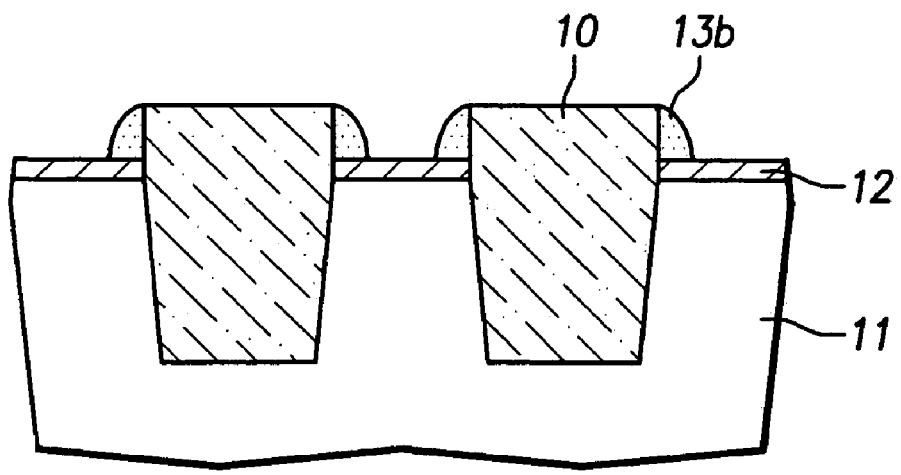

Referring to FIG. 5, a protective nitride 13a is deposited on the substrate. The protective nitride 13a and the pad nitride 13 are isotropically etched, until the pad oxide 12 is exposed, to form spacers 13b, as shown in FIG. 6. The spacers 13b prevent the over-etching of the STI. In addition, the protective nitride 13a prevents the damage of upper portion of STI during the etch process for forming the spacers 13b.

Subsequently, the conventional processes of cleaning steps with sulfuric acid and hydrofluoric acid solutions and ion implantation for well and threshold voltage are performed. In these steps, the spacers 13b protect the corners of STI from being etched by the cleaning solutions, and the pad oxide 12 acts as a sacrificial oxide layer protecting the active regions during the ion implantation step.

In the conventional process, the pad nitride is etched by a wet etching step, and a small portion of the pad oxide is removed, thereby making impossible to use the pad oxide as a sacrificial oxide layer. In contrast, the present invention employs a dry etching step for accurately etching the pad nitride 13b and thus any portions of the pad oxide 12 are removed thereby making possible to use the pad oxide 12 as a sacrificial oxide layer.

Figure 7:
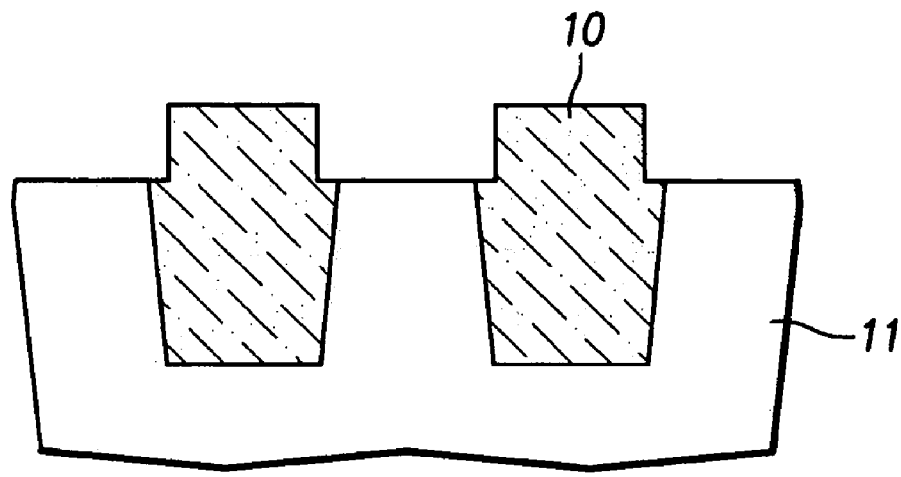
Figure 8:
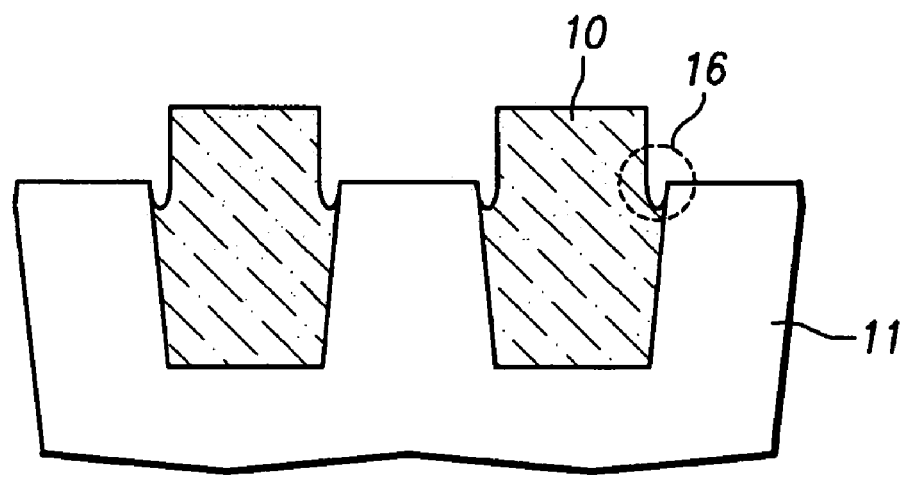
FIG. 8 is a cross-sectional view for showing the divot problem in the conventional STI region.

Referring to FIG. 7, the spacers 13b and pad oxide 12 are sequentially removed to obtain highly reliable STI 10 without any divots. According to the present invention, the spacers 13b are removed by a wet etch step that employs an etchant having high selectivity between nitride material of the spacers 13b and oxide consisting of the STI 10, thereby no divots produced.

As the STI of the present invention has no divots, thickness of each subsequent layers such as gate oxide and gate polysilicon layers can be kept uniform. Therefore, reliable electrical characteristics without the variation of threshold voltage and having no concentration of electric field to the STI corners can be implemented.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for forming a shallow trench isolation (STI) in a semiconductor device, comprising:
   successively forming a pad oxide and a pad nitride on a silicon substrate;
   successively etching the pad nitride, the pad oxide, and the silicon substrate to form a trench having a predetermined depth in the silicon substrate;
   depositing a trench filling oxide to fill the trench;
   polishing the trench filling oxide until the pad nitride is exposed;
   depositing a protective nitride to cover surface of the substrate including the pad nitride and the trench filling oxide; and
   isotropically etching the protective nitride and the pad nitride to form spacers, wherein the spacers are formed on both sides of the STI protruding above the exposed pad oxide.

2. A method for fabricating a semiconductor device comprising:
   (a) forming a shallow trench isolation (STI) in a semiconductor device by:
      (i) successively forming a pad oxide and a pad nitride on a silicon substrate;
      (ii) successively etching the pad nitride, the pad oxide, and the silicon substrate to form a trench having a predetermined depth in the silicon substrate;
      (iii) depositing a trench filling oxide to fill the trench;
      (iv) polishing the trench filling oxide until the pad nitride is exposed;
      (v) depositing a protective nitride to cover surface of the substrate including the pad nitride and the trench filling oxide; and
      (vi) isotropically etching the protective nitride and the pad nitride to form spacers, wherein the spacers are formed on both sides of the STI protruding above the exposed pad oxide;
   (b) successively implanting ions to form a well in the semiconductor substrate and for adjusting threshold voltage by using the pad oxide as a sacrificial oxide layer; and
   (c) removing the spacers.

3. The method of claim 2, wherein the removal of the spacers is carried out by using wet etching process.

4. A semiconductor device fabricated by the method of claim 2.

5. The method of claim 1, further comprising, subsequent to the forming a pad oxide and a pad nitride on a silicon substrate,
   forming a hard mask oxide on the pad nitride; and
   selectively etching the hard mask oxide to expose substrate regions where the STI is to be formed.

6. The method of claim 1, wherein the pad nitride, the pad oxide, and the silicon substrate are successively and selectively etched by using the hard mask oxide as a etch mask.

7. The method of claim 1, wherein the trench filling oxide is tetraethoxysilane (TEOS).

8. The method of claim 1, wherein the trench filling oxide is polished using a chemical mechanical polishing (CMP) process.

* * * * *